(12) United States Patent
Yeh et al.

(10) Patent No.: US 8,125,034 B2
(45) Date of Patent: Feb. 28, 2012

(54) GRADED ARC FOR HIGH NA AND IMMERSION LITHOGRAPHY

(75) Inventors: Wendy H. Yeh, Mountain View, CA (US); Martin J. Seamons, San Jose, CA (US); Matthew Spuller, Palo Alto, CA (US); Sum-Yee Betty Tang, San Jose, CA (US); Kwangduk Douglas Lee, Santa Clara, CA (US); Sudha Rathi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/797,406

(22) Filed: Jun. 9, 2010

(65) Prior Publication Data

US 2010/0239979 A1 Sep. 23, 2010

Related U.S. Application Data

(63) Continuation of application No. 11/488,528, filed on Jul. 18, 2006, now Pat. No. 7,776,516.

(51) Int. Cl.
*H01L 23/48* (2006.01)
(52) U.S. Cl. ......... 257/368; 257/369; 257/437; 257/774
(58) Field of Classification Search .............. 430/9, 325, 430/270.1, 317, 313, 311, 322, 323
See application file for complete search history.

(56) References Cited

U.S. PATENT DOCUMENTS

| | | | |
|---|---|---|---|
| 6,428,894 B1 | 8/2002 | Babich et al. | |
| 6,573,030 B1 | 6/2003 | Fairbairn et al. | |
| 6,841,341 B2 | 1/2005 | Fairbairn et al. | |
| 6,967,072 B2 | 11/2005 | Latchford et al. | |
| 7,223,526 B2 | 5/2007 | Fairbairn et al. | |
| 7,332,262 B2 | 2/2008 | Latchford et al. | |
| 7,335,462 B2 | 2/2008 | Fairbairn et al. | |
| 7,776,516 B2 | 8/2010 | Yeh et al. | |
| 2003/0194496 A1* | 10/2003 | Xu et al. | 427/255.28 |
| 2004/0087139 A1 | 5/2004 | Yeh et al. | |
| 2004/0214446 A1 | 10/2004 | Kim et al. | |
| 2005/0224983 A1 | 10/2005 | Kim et al. | |

FOREIGN PATENT DOCUMENTS

CN 1204698 1/1999

(Continued)

OTHER PUBLICATIONS

The First Office Action in Chinese Patent Application No. 200710142175.6 dated May 8, 2009.

(Continued)

*Primary Examiner* — Kathleen Duda
*Assistant Examiner* — Caleen Sullivan
(74) *Attorney, Agent, or Firm* — Patterson & Sheridan, L.L.P.

(57) ABSTRACT

A method of forming a device using a graded anti-reflective coating is provided. One or more amorphous carbon layers are formed on a substrate. An anti-reflective coating (ARC) is formed on the one or more amorphous carbon layers wherein the ARC layer has an absorption coefficient that varies across the thickness of the ARC layer. An energy sensitive resist material is formed on the ARC layer. An image of a pattern is introduced into the layer of energy sensitive resist material by exposing the energy sensitive resist material to patterned radiation. The image of the pattern introduced into the layer of energy sensitive resist material is developed.

11 Claims, 8 Drawing Sheets

FOREIGN PATENT DOCUMENTS

| | | |
|---|---|---|
| CN | 1437226 | 8/2003 |
| KR | 10-1999-0023841 | 3/1999 |

OTHER PUBLICATIONS

The Second Office Action for Chinese Application No. 200710142175.6 dated Oct. 30, 2009.

Notice of Third Office Action dated Mar. 31, 2010 for Chinese Patent Application No. 200710142175.6.

Office Action dated Aug. 14, 2008 for Korean Patent Application No. 2007-71760.

Prosecution History for U.S. Appl. No. 11/488,528, (2010).

* cited by examiner

GRADED ARC FOR HIGH NA AND IMMERSION LITHOGRAPHY

CROSS-REFERENCE TO RELATED APPLICATIONS

This application is a continuation of U.S. patent application Ser. No. 11/488,528, filed on Jul. 18, 2006 now U.S. Pat. No. 7,776,516, which is incorporated herein by reference.

BACKGROUND OF THE INVENTION

1. Field of the Invention

The present invention generally relates to a graded anti-reflective coating, its use in integrated circuit fabrication, and a method for depositing the graded anti-reflective coating.

2. Description of the Related Art

In recent years integrated circuits have evolved into complex devices that commonly include millions of transistors, capacitors, resistors, and other electronic components on a single chip. Therefore, there is an inherent demand for increased circuit densities, as well as a continual demand for faster and more efficient circuit components. The combined demands for faster circuits having greater circuit densities imposes corresponding demands on the materials used to fabricate such integrated circuits. This demand for faster circuits with greater circuit densities has led to the use of low resistivity conductive materials, such as copper and/or low dielectric constant insulating materials having a dielectric constant less than about 3.8.

The demands for faster components having greater circuit densities also imposes demands on process sequences used for integrated circuit manufacture. For example, in process sequences using conventional lithographic techniques, a layer of energy sensitive resist is generally formed over a stack of material layers on a substrate. An image of a pattern may then be introduced into the energy sensitive resist layer. Thereafter, the pattern introduced into the energy sensitive resist layer may be transferred into one or more layers of the material stack formed on the substrate using the layer of energy sensitive resist as a mask. The pattern introduced into the energy sensitive resist may then be transferred into a material layer(s) using a chemical and/or physical etchant. A chemical etchant is generally designed to have a greater etch selectivity for the material layer(s) than for the energy sensitive resist, which generally indicates that the chemical etchant will etch the material layer(s) at a faster rate than it etches the energy sensitive resist. The faster etch rate for the one or more material layers of the stack typically prevents the energy sensitive resist material from being consumed prior to completion of the pattern transfer.

Lithographic imaging tools used in the manufacture of integrated circuits employ deep ultraviolet (DUV) imaging wavelengths, i.e., wavelengths of 248 nm or 193 nm, to generate resist patterns. The DUV imaging wavelengths are generally known to improve resist pattern resolution as a result of the diffraction effects being reduced at the shorter wavelengths. However, the increased reflective nature of many underlying materials, i.e., polysilicon and metal silicides, for example, may operate to degrade the resulting resist patterns at DUV wavelengths. Furthermore, for printing features with smaller pitches ($\leq$250-300 nm) immersion lithography using lenses with a high numerical aperture is typically used. As the numerical aperture (NA) increases beyond 0.9, and pitch sizes decrease to less than 100 nm, light reflectance from non-normal incidence angles becomes a significant source of reflection.

One technique proposed to minimize reflections from an underlying material layer uses an anti-reflective coating (ARC). The ARC is formed over the reflective material layer prior to resist patterning. The ARC generally suppresses the reflections off the underlying material layer during resist imaging, thereby providing more accurate pattern replication in the layer of energy sensitive resist. However, currently available anti-reflective coating techniques fail to account for the light reflectance from non-normal incidence angles.

In view of conventional photolithographic techniques, there exists a need in the art for an anti-reflective coating that reduces light reflectance from non-normal incidence angles.

SUMMARY OF THE INVENTION

Embodiments of the invention pertain to forming a graded anti-reflective coating. According to one embodiment one or more amorphous carbon layers are formed on a substrate. An anti-reflective coating (ARC) is formed on the one or more amorphous carbon layers wherein the ARC layer has an absorption coefficient that varies across the thickness of the ARC layer. An energy sensitive resist material is formed on the ARC layer. An image of a pattern is introduced into the layer of energy sensitive resist material by exposing the energy sensitive resist material to patterned radiation. The image of the pattern introduced into the layer of energy sensitive resist material is developed. In another embodiment, the ARC layer and the amorphous carbon layer are deposited in-situ in the same processing system or the same processing chamber without breaking vacuum.

According to another embodiment, a method of forming a device is provided. The method comprises forming one or more amorphous carbon layers on a substrate. An ARC layer is formed on the one or more amorphous carbon layers wherein the ARC layer has an absorption coefficient that varies across the thickness of the ARC layer, wherein the one or more amorphous carbon layers and the ARC layer are deposited in-situ in the same processing system or the same processing chamber without breaking vacuum.

According to another embodiment, a layer of anti-reflective coating (ARC) material for use in a photolithographic process is provided. The ARC layer is formed from a gas mixture comprising one or more carbon sources, a silicon source, and an oxygen source wherein the ARC layer has an absorption coefficient that varies across the thickness of the ARC layer. In another embodiment, the gas mixture further comprises an inert gas.

In additional embodiments, the ARC layer has an absorption coefficient in a range between about 0 and about 1.0. In another embodiment, the ARC layer is formed by modulating the flow of one or more carbon sources, an inert gas, a silicon source, and an oxygen source.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide a graded anti-reflective coating, use of the graded anti-reflective coating in integrated circuit fabrication, and a method for depositing the graded anti-reflective coating. The optical properties, specifically the optical properties measured by the light absorption coefficient (k) and the index of refraction (n) continuously vary throughout the film.

Figure 1:
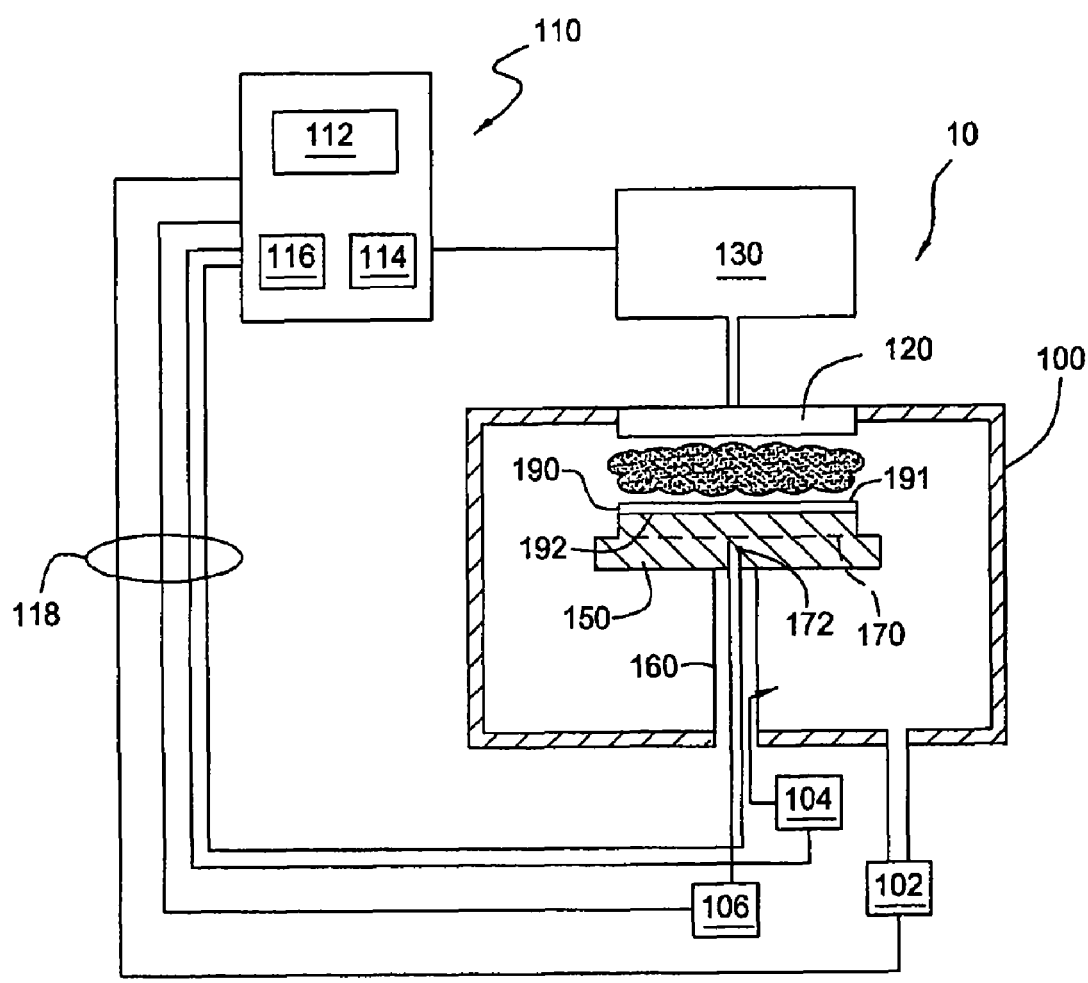
FIG. 1 illustrates a schematic of an apparatus that may be used to practice embodiments of the invention.

FIG. 1 illustrates schematic representation of a wafer processing system 10 that may be used to perform graded ARC and amorphous carbon layer deposition. This apparatus generally includes a process chamber 100, a gas panel 130, a control unit 110, and other hardware components, such as power supplies, vacuum pumps, etc. that are known in the art to be used to manufacture integrated circuit components. Examples of the system 10 may include CENTURA® systems, PRECISION 5000®, systems and PRODUCER™ systems, all of which are commercially available from Applied Materials Inc., of Santa Clara, Calif.

The process chamber 100 generally includes a support pedestal 150, which is used to support a substrate, such as a semiconductor wafer 190. This pedestal 150 may typically be moved in a vertical direction inside the chamber 100 using a displacement mechanism 160. Depending on the specific process, the wafer 190 may be heated to a desired temperature by an embedded heating element 170 within pedestal 150. For example, the pedestal 150 may be resistively heated by applying an electric current from an AC supply 106 to the heating element 170, which then heats the wafer 190. A temperature sensor 172, such as a thermocouple, for example, may be embedded in the wafer support pedestal 150 in order to monitor the temperature of the pedestal 150 through cooperative interaction with a process control system (not shown). The temperature read by the thermocouple may be used in a feedback loop to control the power supply 106 for the heating element 170 such that the wafer temperature can be maintained or controlled at a desired temperature that is suitable for the particular process application. Alternatively, the pedestal 150 may utilize alternative heating and/or cooling configurations known in the art, such as, plasma and/or radiant heating configurations or cooling channels (not shown).

A vacuum pump 102 may be used to evacuate the process chamber 100 and to maintain the desired gas flows and dynamic pressures inside the chamber 100. A showerhead 120, through which process gases may be introduced into the chamber 100, may be located above the wafer support pedestal 150. The showerhead 120 may generally be connected to a gas panel 130, which controls and supplies various gases used in different steps of the process sequence.

The showerhead 120 and wafer support pedestal 150 may also form a pair of spaced electrodes. Therefore, when an electric field is generated between these electrodes, the process gases introduced into the chamber 100 by the showerhead 120 may be ignited into a plasma, assuming that the potential between the spaced electrodes is sufficient to initiate and maintain the plasma. Typically, the driving electric field for the plasma is generated by connecting the wafer support pedestal 150 to a source of radio frequency (RF) power 104 through a matching network (not shown). Alternatively, the RF power source and matching network may be coupled to the showerhead 120, or coupled to both the showerhead 120 and the wafer support pedestal 150.

Plasma enhanced chemical vapor deposition (PECVD) techniques generally promote excitation and/or disassociation of the reactant gases by the application of the electric field to a reaction zone near the substrate surface, creating a plasma of reactive species immediately above the substrate surface. The reactivity of the species in the plasma reduces the energy required for a chemical reaction to take place, in effect lowering the required temperature for such PECVD processes.

In embodiments of the invention, amorphous carbon layer deposition is accomplished through plasma enhanced thermal decomposition of a hydrocarbon compound, such as propylene ($C_3H_6$) for example. Propylene may be introduced into the process chamber 100 under the control of the gas panel 130. The hydrocarbon compound may be introduced into the process chamber as a gas with a regulated flow through the showerhead 120, for example.

Proper control and regulation of the gas flows through the gas panel 130 may be conducted by one or more mass flow controllers (not shown) and a control unit 110 such as a computer. The showerhead 120 allows process gases from the gas panel 130 to be uniformly distributed and introduced into the process chamber 100 proximate the surface of the wafer. Illustratively, the control unit 110 may include a central processing unit (CPU) 112, support circuitry 114, and various memory units containing associated control software 116 and/or process related data. Control unit 110 may be responsible for automated control over various steps required for wafer processing, such as wafer transport, gas flow control, temperature control, chamber evacuation, and other processes known in the art to be controlled by an electronic controller. Bi-directional communications between the control unit 110 and the various components of the apparatus 10 may be handled through numerous signal cables collectively referred to as signal buses 118, some of which are illustrated in FIG. 1.

The heated pedestal 150 used in the present invention may be manufactured from aluminum, and may include a heating element 170 embedded at a distance below the wafer support surface 192 of the pedestal 150. The heating element 170 may be manufactured from a nickel-chromium wire encapsulated in an Incoloy sheath tube. By properly adjusting the current supplied to the heating element 170, the wafer 190 and the pedestal 150 may be maintained at a relatively constant temperature during wafer preparation and film deposition processes. This may be accomplished through a feedback control loop, in which the temperature of the pedestal 150 is continuously monitored by the temperature sensor 172 embedded in the pedestal 150. This information may be transmitted to the control unit 110 via a signal bus 118, which may respond by sending the necessary signals to the heater power supply. Adjustment may subsequently be made in the power supply 106 so as to maintain and control the pedestal 150 at a desirable temperature, i.e., a temperature that is appropriate for the specific process application. Therefore, when the process gas mixture exits the showerhead 120 above the wafer 190, plasma enhanced thermal decomposition of the hydrocarbon compound occurs at the surface 191 of the heated wafer 190, resulting in a deposition of an amorphous carbon layer on the wafer 190.

In one embodiment of the invention the graded ARC layer can be formed by a plasma CVD reaction of a carbon source, a silicon source, and an oxygen source. In some embodiments an inert gas such as helium or argon is also added to stabilize the plasma and control the deposition rate. In one specific embodiment a graded ARC layer is formed by forming a plasma and varying the composition of a gaseous mixture comprising methylsilane, carbon dioxide, and helium. Such a deposition process beneficially incorporates oxygen into the film, which also helps vary the light absorption coefficient of the graded ARC layer.

The graded ARC material according to the present invention can be deposited to have, at deep UV radiation wavelengths, a varying refractive index (n) of between about 1 and about 2.2 inclusive. In some specific embodiments the light absorption coefficient (k) can be varied significantly (e.g. between about 0 and 1.0) over a narrow refractive index range of between 1 and 2.2 inclusive.

The as-deposited graded ARC layer generally has an adjustable oxygen, carbon, and hydrogen content. Controlling the oxygen, carbon, and hydrogen content of the graded ARC layer is desirable for tuning its optical properties. For example, as the oxygen content increases the light absorption coefficient decreases.

The light absorption coefficient of the graded ARC layer may be varied between about 0 to about 1.0 at wavelengths below about 250 nm, making it suitable for use as an antireflective coating (ARC) at DUV wavelengths. The absorption coefficient of the graded ARC layer may be varied as a function of the deposition temperature.

The absorption coefficient of the graded DARC layer may also be varied as a function of the additive used in the gas mixture. In particular, the presence of $H_2$ in the gas mixture can increase the k value by about 10% to about 100%. The absorption coefficient may also be modified by varying power. For example, the k value will increase as power decreases. Another way to modify the k value is to modify the flow rate of gases. For example, increasing the flow of silane or other Si—H containing molecule will increase the k value.

Integrated Circuit Fabrication Processes

A. Graded ARC with Amorphous Carbon Hardmask

Figure 2A:
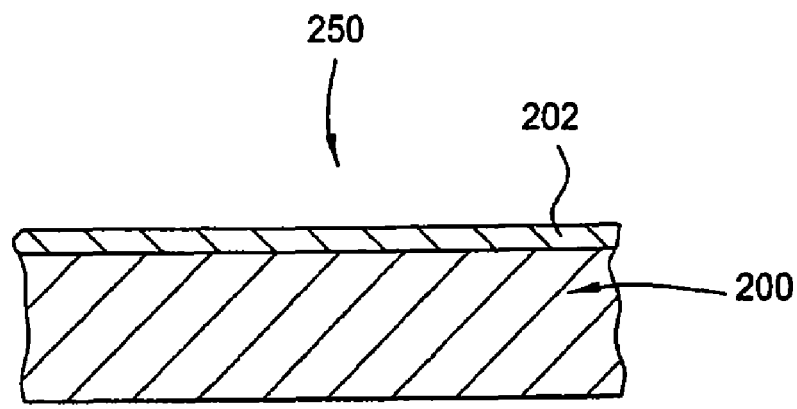
FIGS. 2a-2e illustrate schematic cross-sectional views of a substrate structure at different stages of integrated circuit fabrication incorporating one embodiment of the graded anti-reflective coating of the current invention.

FIGS. 2a-e illustrate schematic cross-sectional views of a substrate 200 at different stages of an integrated circuit fabrication sequence incorporating a graded DARC layer with an amorphous carbon layer as a hardmask. In general, the substrate 200 refers to any workpiece on which processing is performed, and a substrate structure 250 is used to generally denote the substrate 200 together with other material layers formed on the substrate 200. The substrate 200 may be part of a larger structure (not shown), such as a STI (shallow trench isolation) structure, a gate device for a transistor, a DRAM device, or a dual damascene structure as in the current example. Depending on the specific stage of processing, the substrate 200 may correspond to a silicon substrate, or other material layer that has been formed on the substrate. FIG. 2a, for example, illustrates a cross-sectional view of a substrate structure 250, having a material layer 202 that has been conventionally formed thereon. The material layer 202 may be an oxide (e.g., $SiO_2$). In general, the substrate 200 may include a layer of silicon, silicides, metals, or other materials. FIG. 2a illustrates one embodiment in which the substrate 200 is silicon having a silicon dioxide layer formed thereon.

Figure 2B:
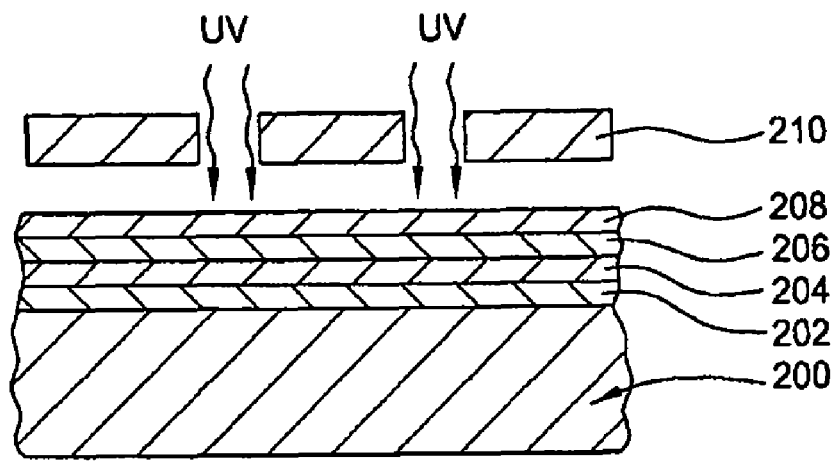

FIG. 2b illustrates an amorphous carbon layer 204 deposited on the substrate structure 250 of FIG. 2a. The amorphous carbon layer 204 is formed from a gas mixture of a hydrocarbon compound and an inert gas such as Argon (Ar) or helium (He). The hydrocarbon compound has a general formula $C_xH_y$, where x has a range of between 2 and 10 and y has a range of between 2 and 22. For example, propylene ($C_3H_6$), propyne ($C_3H_4$), propane ($C_3H_8$), butane ($C_4H_{10}$), butylene ($C_4H_8$), butadiene ($C_4H_6$), acetylene ($C_2H_2$), pentane, pentene, pentadiene, cyclopentane, cyclopentadiene, benzene, toluene, alpha terpinene, phenol, cymene, norbornadiene, as well as combinations thereof, may be used as the hydrocarbon compound. Liquid precursors may be used to deposit amorphous carbon films. The use of liquid precursors in the deposition of amorphous carbon films is further discussed in United States Patent Application Publication No. 2005/0287771, published Dec. 29, 2005, entitled LIQUID PRECURSORS FOR THE CVD DEPOSITION OF AMORPHOUS CARBON FILMS, which is herein incorporated by reference to the extent it does not conflict with the current specification. These liquid precursors include but are not limited to toluene, alpha terpinene (A-TRP), and norbornadiene (BCHD). Similarly, a variety of gases such as hydrogen ($H_2$), nitrogen ($N_2$), ammonia ($NH_3$), or combinations thereof, among others, may be added to the gas mixture, if desired. Argon (Ar), helium (He), and nitrogen ($N_2$) may be used to control the density and deposition rate of the amorphous carbon layer. The addition of $H_2$ and/or $NH_3$ can be used to control the hydrogen ratio of the amorphous carbon layer.

In general, the following deposition process parameters may be used to form the amorphous carbon layer. The process parameters range from a wafer temperature of about 100° C. to about 500° C., a chamber pressure of about 1 torr to about 20 torr, a hydrocarbon gas ($C_xH_y$) flow rate of about 50 sccm to about 50,000 sccm (per 8 inch wafer—for example), a RF power of between about 3 W/in$^2$ to about 20 W/in$^2$, and a plate spacing of between about 200 mils to about 1,200 mils. The above process parameters provide a typical deposition rate for the amorphous carbon layer in the range of about 100 Å/min to about 10,000 Å/min and may be implemented on a 300 mm substrate in a deposition chamber available from Applied Materials, Inc. of Santa Clara, Calif. The thickness of the amorphous carbon layer is variable, depending on the specific stage of processing. Typically, the amorphous carbon layer may have a thickness in the range of about 500 Å to about 10,000 Å.

Further aspects of one embodiment of the amorphous carbon layer 204 are described in commonly assigned U.S. Pat. No. 6,573,030, issued Jun. 3, 2003, entitled METHOD FOR DEPOSITING AN AMORPHOUS CARBON LAYER, which is incorporated herein by reference to the extent it does not conflict with the current specification.

The graded ARC layer 206 may be formed on the amorphous carbon layer 204. The graded ARC layer 206 suppresses the reflections of the underlying layers providing accurate pattern replication of the layer of energy sensitive resist. The graded ARC layer 206 may be conventionally formed on the amorphous carbon layer 204 using a variety of CVD processes such as PECVD. In one embodiment, the graded ARC layer 206 is formed by forming a plasma from a gaseous mixture of a carbon source, a silicon source, an oxygen source, and an inert gas. The silicon source may include silane, disilane, chlorosilane, dichlorosilane, trimethylsilane, and tetramethylsilane. The silicon source may also include an organosilicon compounds such as tetraethoxysilane (TEOS), triethoxyfluorosilane (TEFS), 1,3,5,7-tetramethylcyclotetrasiloxane (TMCTS), dimethyldiethoxy silane (DMDE), octomethylcyclotetrasiloxane (OMCTS), and combinations thereof. The oxygen source may include oxygen ($O_2$), ozone ($O_3$), nitrous oxide ($N_2O$), carbon monoxide (CO), carbon dioxide ($CO_2$), water ($H_2O$), 2,3-butanedione, or combinations thereof. The inert gas is selected from a group comprising argon, helium, neon, krypton, xenon, and combinations thereof. The carbon sources are selected from a group comprising propylene ($C_3H_6$), propyne ($C_3H_4$), propane ($C_3H_8$), butane ($C_4H_6$), butylene ($C_4H_8$), butadiene ($C_4H_6$), acetelyne ($C_2H_2$), pentane, pentene, pentadiene, cyclopentane, cyclopentadiene, benzene, toluene, alpha terpinene, phenol, cymene, norbornadiene, as well as combinations thereof. In one embodiment, the gaseous mixture comprises silane (flow rate of 10-2000 sccm), carbon dioxide (flow rate of 100-100000 sccm), and helium flow rate of 0-10000 sccm). The varying optical properties of the ARC layer are achieved by varying the flow rates of the aforementioned gases.

In one embodiment, the amorphous carbon and graded ARC layer are formed in-situ in the same system or process chamber without breaking vacuum. This in-situ layer functions not only as an anti-reflective coating but also functions as a hardmask. The in-situ layer is deposited under the same conditions as the amorphous carbon layer but a silicon source such as silicon, silicon carbide, trimethylsilane, or silane is added followed by an oxygen precursor. Flow modulation of the gases in the chamber allows for graded deposition of the in-situ layer.

A layer of energy sensitive resist material 208 may be formed on the graded ARC layer 206. The layer of energy sensitive resist material 208 may be spin coated on the substrate to a thickness within the range of about 2000 Å to about 6000 Å. Most energy sensitive resist materials are sensitive to ultraviolet (UV) radiation having a wavelength less than about 450 nm. DUV resist materials are generally sensitive to UV radiation having wavelengths of 245 nm or 193 nm. In one embodiment, an adhesion promoter, such as hexamethyldisilazane (HMDS), which serves to bond the energy sensitive resist material to the ARC layer, is used between the graded ARC layer 206 and the energy sensitive resist material 208.

Figure 2C:
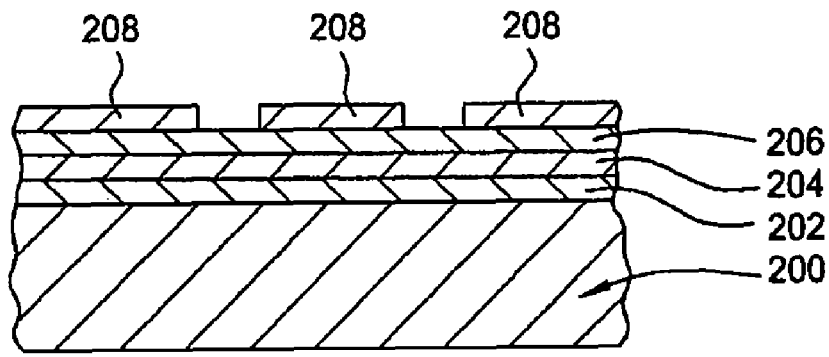
Figure 2D:
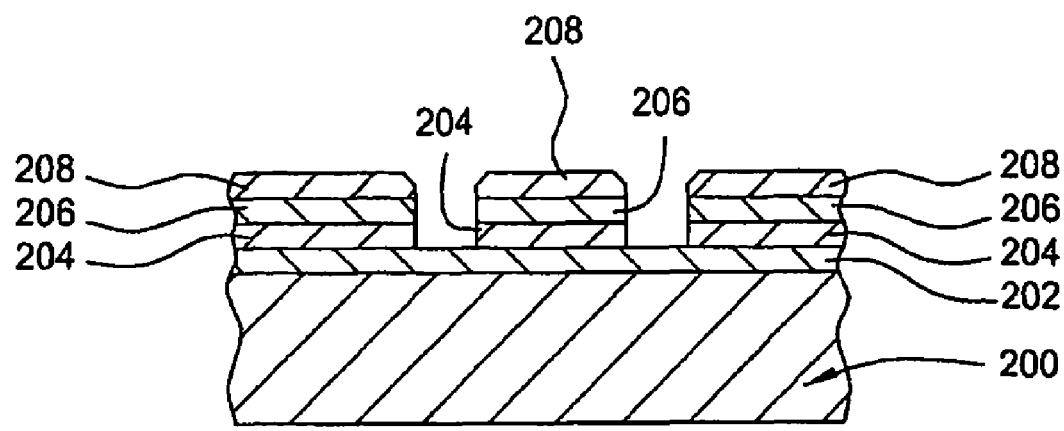

An image of a pattern may be introduced into the layer of energy sensitive resist material 208 by exposing such energy sensitive resist material 208 to UV radiation via mask 210. The image of the pattern introduced in the layer of energy sensitive resist material 208, may be developed in an appropriate developer to define the pattern through such layer, as shown in FIG. 2c. Thereafter, referring to FIG. 2d, the pattern defined in the energy sensitive resist material 208 is transferred through both the graded ARC layer 206 and the amorphous carbon layer 204. The pattern is transferred through both the graded ARC layer 206 and the amorphous carbon layer 204 using the energy sensitive resist material 208 as a mask. The pattern is transferred through the graded ARC layer 206 using a gas mixture comprising a hydrogen-containing fluorocarbon ($C_xF_yH_z$) and one or more gases selected from the group consisting of hydrogen ($H_2$), nitrogen ($N_2$), oxygen ($O_2$), argon (Ar), and helium (He). The amorphous carbon layer 204 can be etched using ozone, oxygen, or ammonia plasmas alone or in combination with hydrogen bromide (HBr), nitrogen ($N_2$), carbon tetrafluoride ($CF_4$), argon (Ar), and others. Both layers can be etched in-situ with different process steps. In-situ should be broadly construed and includes, but is not limited to, in a given chamber, such as in a plasma chamber, or in a system, such as an integrated cluster tool arrangement, without exposing the material to intervening contamination environments, such as breaking vacuum between process steps or chambers within a tool. An in-situ process typically minimizes process time and possible contaminants compared to relocating the substrate to other processing chambers or areas.

Figure 2E:
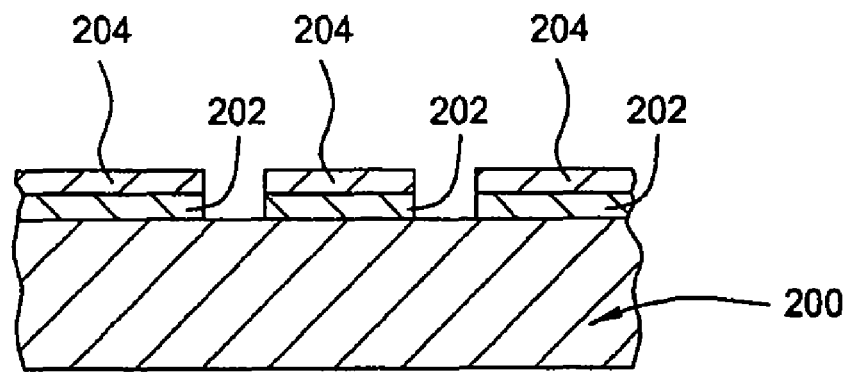

FIG. 2e illustrates the completion of the integrated circuit fabrication sequence by the transfer of the pattern defined in the amorphous carbon layer 204 through the silicon dioxide layer 202 using the amorphous carbon layer 204 as a hardmask. After the silicon dioxide layer 202 is patterned, the amorphous carbon layer 204 may be stripped from the substrate 200 by etching it in an ozone, oxygen, ammonia plasma alone or in combination with fluorinated compounds, nitrogen, or hydrogen plasmas.

In a specific example of a fabrication sequence, the pattern defined in the graded ARC layer and the amorphous carbon hardmask may be incorporated into the structure of the integrated circuit, such as a damascene structure. Damascene structures are typically used to form metal interconnects on integrated circuits. Other structures include a STI (shallow trench isolation) structure, a gate device for a transistor, a DRAM device, or a dual damascene structure.

Figure 3A:
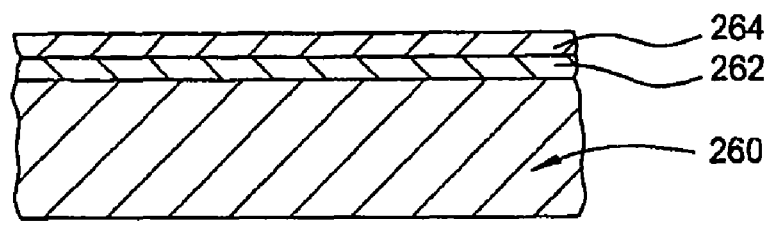
FIGS. 3a-3e illustrate schematic cross-sectional views of a damascene structure at different stages of integrated circuit fabrication incorporating one embodiment of the graded anti-reflective coating of the current invention.

FIGS. 3a-3e illustrate schematic cross-sectional views of a substrate 260 at different stages of a damascene structure fabrication sequence incorporating an amorphous carbon layer therein. Depending on the specific stage of processing, substrate 260 may correspond to a silicon substrate, or other material layer that has been formed on the substrate. FIG. 3a, for example, illustrates a cross-sectional view of a substrate 260 having a dielectric layer 262 formed thereon. The dielectric layer 262 may be an oxide (e.g., silicon dioxide, fluorosilicate glass). In general, the substrate 260 may include a layer of silicon, silicides, metals, or other materials known in the art as dielectric layers. Other embodiments contemplate the use of non-dielectric materials, such as, conductive or semiconductive materials.

Figure 3B:
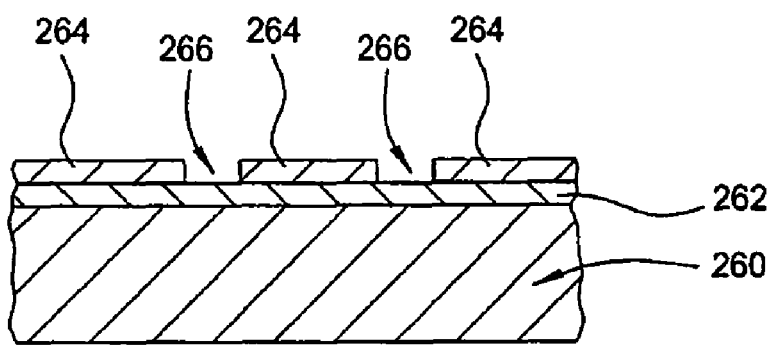

FIG. 3a illustrates an embodiment of the invention in which the substrate 260 is silicon having a fluorosilicate glass layer formed thereon. The dielectric layer 262 has a thickness of about 5,000 Å to about 10,000 Å, depending on the size of the structure to be fabricated. A graded ARC layer 264 is formed on the dielectric layer according to the process parameters discussed above. In one embodiment graded ARC layer and an amorphous carbon layer are formed in-situ, represented by in-situ layer 264. The in-situ layer 264 functions both as an anti-reflective coating and as a hardmask. The in-situ layer 264 is deposited under the same conditions as the amorphous carbon layer but a silicon source such as silicon, silicon carbide, TMS, or silane is added followed by an oxygen precursor. Flow modulation of the gases in the chamber allows for graded deposition of the in-situ layer 264. The amorphous carbon portion of in-situ layer 264 has a thickness of about 500 Å to about 1 µm and the graded ARC portion of in-situ layer 264 can be between about 200 Å to about 2000 Å. Referring to FIG. 3b, the in-situ layer 264 may be patterned and etched to define contact/via openings 266 and to expose the dielectric layer 262, in areas where the contacts/vias are to be formed. The in-situ layer 264 may be patterned using conventional lithography techniques and etched using oxygen and/or ammonia plasmas. The pattern may be transferred through the graded ARC portion of in-situ layer 264 using a gas mixture comprising a hydrogen-containing fluorocarbon ($C_xF_yH_z$) and one or more gases selected from the group consisting of hydrogen ($H_2$), nitrogen ($N_2$), oxygen ($O_2$), argon (Ar), and helium (He). The amorphous carbon layer portion of in-situ layer 264 may be etched using ozone, oxygen, or ammonia plasmas alone or in combination with hydrogen bromide (HBr), nitrogen ($N_2$), carbon tetrafluoride ($CF_4$), argon (Ar), and others. Both layers can be etched in-situ with different process steps.

Figure 3C:
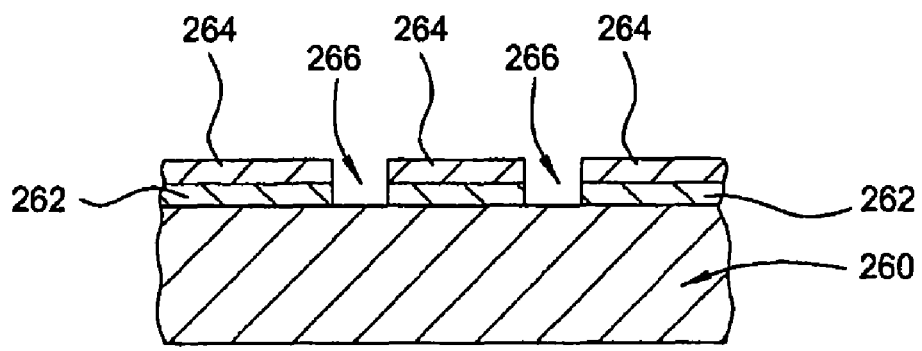
Figure 3D:
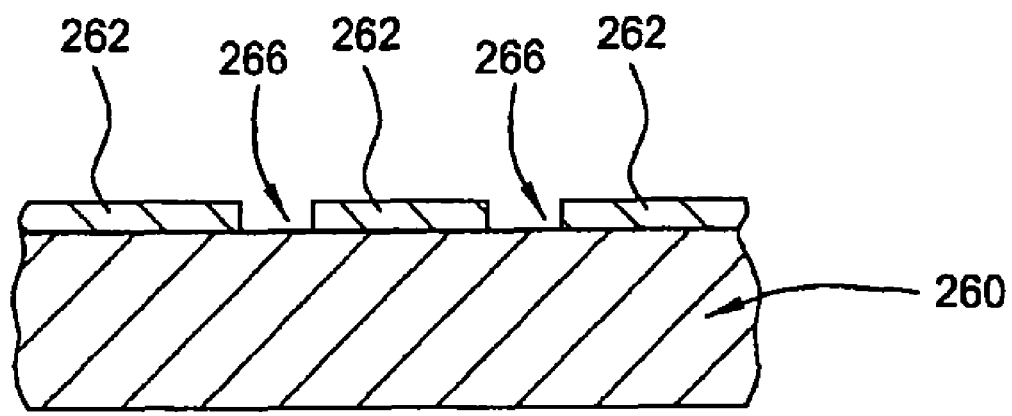

The contact/via openings 266 formed in the in-situ layer 264 may be transferred into the dielectric layer 262 using the amorphous carbon portion of the in-situ layer 264 as a hard mask as shown in FIG. 3c. The contacts/vias 266 are etched using reactive ion etching or other anisotropic etching techniques. After the contacts/vias 266 are transferred into the dielectric layer 262, the remaining in-situ layer 264 may be stripped from dielectric layer 262 using the etchants discussed above, as illustrated in FIG. 3d.

Figure 3E:
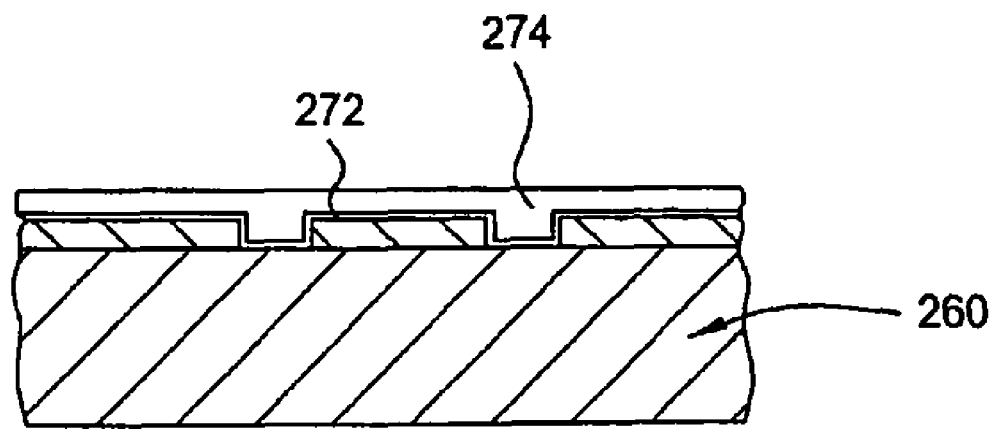

Referring to FIG. 3e, a metallization structure may be formed in the contacts/vias 266 using a conductive material 274 such as aluminum, copper, tungsten, or combinations thereof. Typically, copper is used to form the metallization structure due to its low resistivity (about 1.7 $\mu\Omega$-cm). The conductive material 274 may be deposited using chemical vapor deposition, physical vapor deposition, electroplating, or combinations thereof, to form the damascene structure. Preferably, a barrier layer 272 such as tantalum, tantalum nitride, or other suitable barrier is first deposited conformally in the metallization structure in order to prevent metal migration into the surrounding dielectric material layer 262. Additionally, the dielectric layer 262 preferably has a low dielectric constant (dielectric constants less than about 4.5) so as to prevent capacitive coupling between adjacent contacts/vias 266 of the metallization structure.

B. Graded Anti-Reflective Coating (ARC)

Figure 4A:
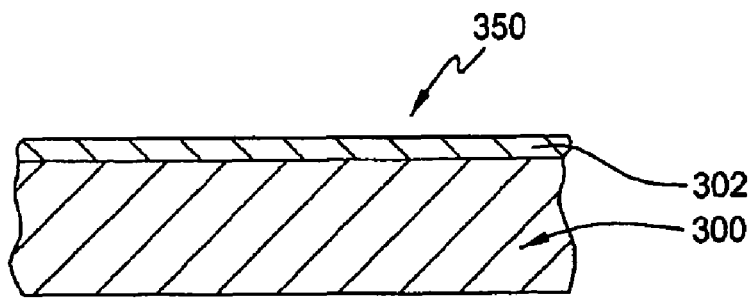
FIGS. 4a-4c illustrate schematic cross-sectional views of a substrate structure at different stages of integrated circuit fabrication incorporating one embodiment of the graded anti-reflective coating of the current invention.
Figure 4B:
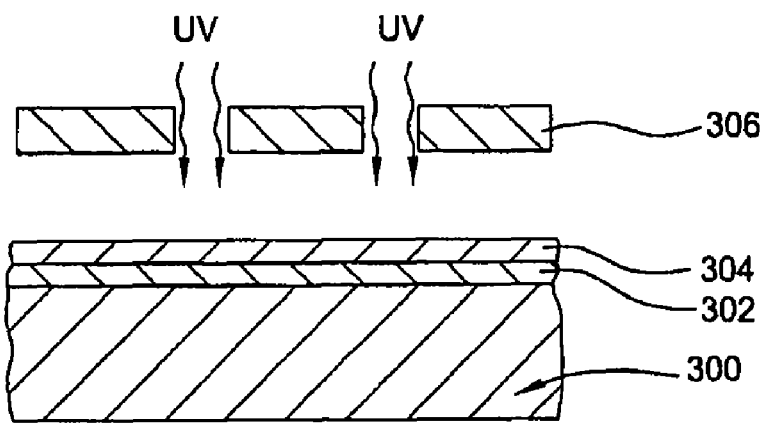
Figure 4C:
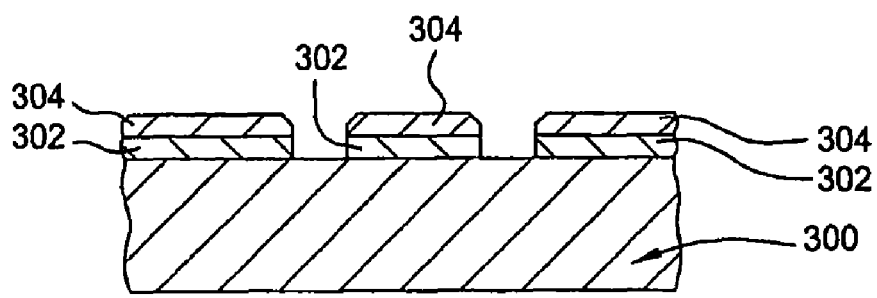

FIGS. 4a-4c illustrate schematic cross-sectional views of a substrate 300 at different stages of an integrated circuit fabrication sequence incorporating a graded anti-reflective coating (ARC). In general, the substrate 300 refers to any workpiece on which film processing is performed, and a substrate structure 350 may be used to generally denote the substrate 300 together with other material layers formed on the substrate 300. Depending on the specific stage of processing, substrate 300 may correspond to a silicon substrate, or other material layer, which has been formed on the substrate. FIG. 4a, for example, illustrates a cross-sectional view of a substrate structure 350 in which the substrate 300 is an oxide layer formed on a silicon wafer.

A graded ARC layer 302 may be formed on substrate 300 according to the process parameters described above. The graded ARC layer may have a refractive index (n) in the range of about 1.0 to 2.2 and an absorption coefficient (k) in the range of about 0 to about 1.0 at wavelengths less than about 250 nm, thus making it suitable for use as an ARC at DUV wavelengths. The graded ARC layer includes an absorption coefficient (k) that varies across the thickness of the layer. That is, the graded ARC layer has an absorption coefficient gradient formed therein. Such a gradient is formed as a function of the temperature and the composition of the gas mixture during layer formation. When the graded ARC has a gradient, it is possible for the refractive indices (n) and the absorption coefficients (k) of the two material layers to be similar so there is minimal reflection and maximum transmission into the graded ARC. Then the refractive index (n) and absorption coefficient (k) of the amorphous carbon ARC may be gradually adjusted to absorb all of the light transmitted therein. In this embodiment, the n and k values of the bottom of the graded ARC layer are similar to the n & k values of the substrate. In one embodiment, the absorption coefficients (k) of the two material layers match within a range between about +/−0.05.

The thickness of the graded ARC layer may also be varied depending on the specific stage of processing. Typically, the graded ARC layer has a thickness of about 200 Å to about 2000 Å.

FIG. 4b depicts a layer of energy sensitive resist material 304 formed on the substrate structure 350 of FIG. 4a. The layer of energy sensitive resist material can be spin coated on the substrate to a thickness within the range of about 2000 Å to about 6000 Å. The energy sensitive resist material may be selected as a material that is sensitive to DUV radiation having a wavelength less than 250 nm. In this embodiment, the n & k values at the top of the graded ARC layer correspond to the n & k values of the energy sensitive resist.

An image of a pattern may be introduced into the layer of energy sensitive resist material 304 by exposing such energy sensitive resist material 304 to DUV radiation via mask 306. The image of the pattern introduced into the layer of energy sensitive resist material 304 may be developed in an appropriate developer to define the pattern through such layer. Thereafter, as shown in FIG. 4c, the pattern defined in the energy sensitive resist material 304 may be transferred through the graded ARC layer 302. The pattern may be transferred through the graded ARC layer 302 using the energy sensitive resist material 304 as a mask. The pattern may be transferred through the graded ARC layer 302 by etching it using a gas mixture comprising a hydrogen-containing fluorocarbon ($C_xF_yH_z$) and one or more gases selected from the group consisting of hydrogen ($H_2$), nitrogen ($N_2$), oxygen ($O_2$), argon (Ar), and helium (He). After the graded ARC layer 302 is patterned, such pattern may be optionally transferred into the substrate 300.

C. Multi-Layer Graded Anti-Reflective Coating (ARC)

Figure 5A:
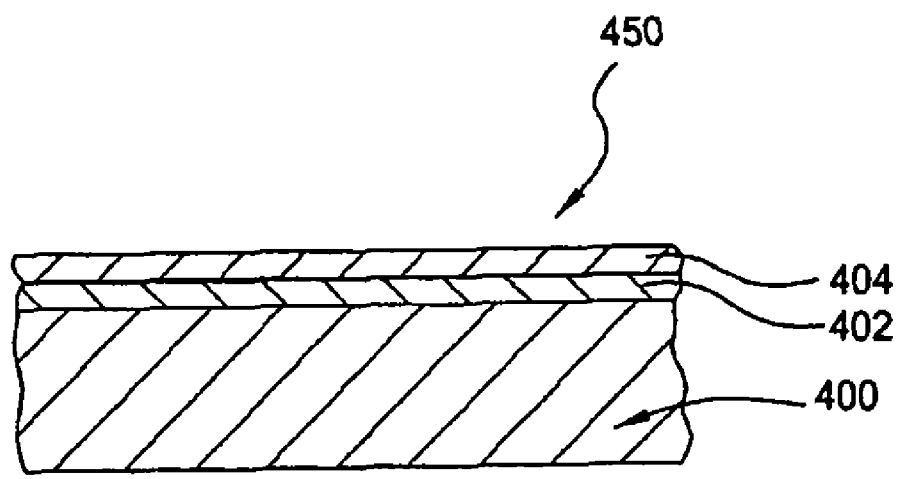
FIGS. 5a-5d illustrate schematic cross-sectional views of a substrate structure at different stages of integrated circuit fabrication incorporating a multi-layer graded ARC structure.

FIGS. 5a-5d illustrate schematic cross-sectional views of a substrate 400 at different stages of an integrated circuit fabrication sequence incorporating a multi-layer graded anti-reflective coating (ARC) structure. In general, the substrate 400 refers to any workpiece on which film processing is performed and a substrate structure 450 is used to generally denote the substrate 400 together with other material layers formed on the substrate 400. Depending on the specific stage of processing, substrate 400 may correspond to a silicon substrate, or other material layer, which has been formed on the substrate. FIG. 5a, for example, illustrates a cross-sectional view of a substrate structure 450 in which the substrate 400 is a silicon wafer.

A first graded ARC layer 402 may be formed on the substrate 400 according to the process parameters described above. The first graded ARC layer 402 may be designed primarily for light absorption, and as such, the first graded ARC layer 402 may have an index of refraction in the range of about 1.0 and about 2.2 and an absorption coefficient (k) in the range of about 0.0 to about 1.0 at wavelengths less than about 250 nm. The thickness of the first graded ARC layer 402 may be variable depending on the specific stage of processing. Typically, the first graded ARC layer 402 has a thickness in the range of about 300 Å to about 1500 Å.

A second graded ARC layer 404 may be formed on the first graded ARC layer 402. The second graded ARC layer 404 may also be formed according to the process parameters described above. The second graded ARC layer 404 may also have an index of refraction in the range of about 1.0 and about 2.2 and an absorption coefficient (k) in the range of about 0.0 to about 1.0 at wavelengths less than about 250 nm. Additional graded ARC layers may be included in the multi-layered graded ARC structure.

Figure 5B:
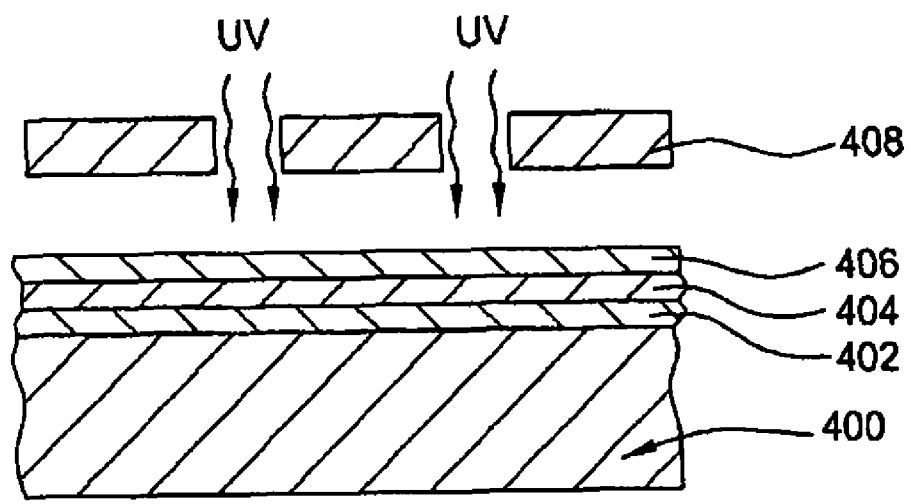
Figure 5C:
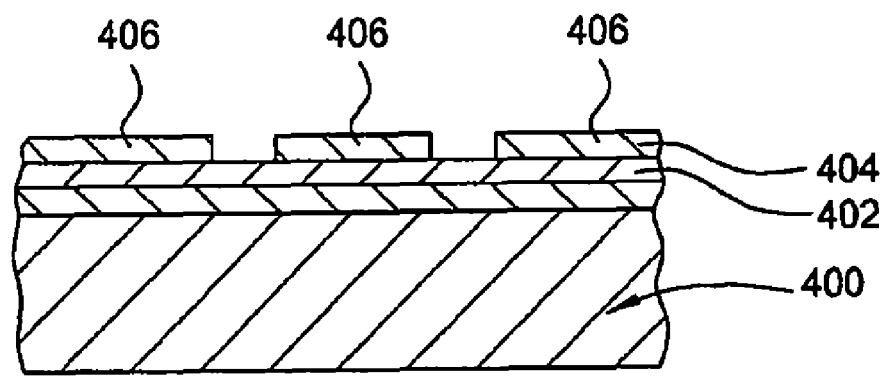
Figure 5D:
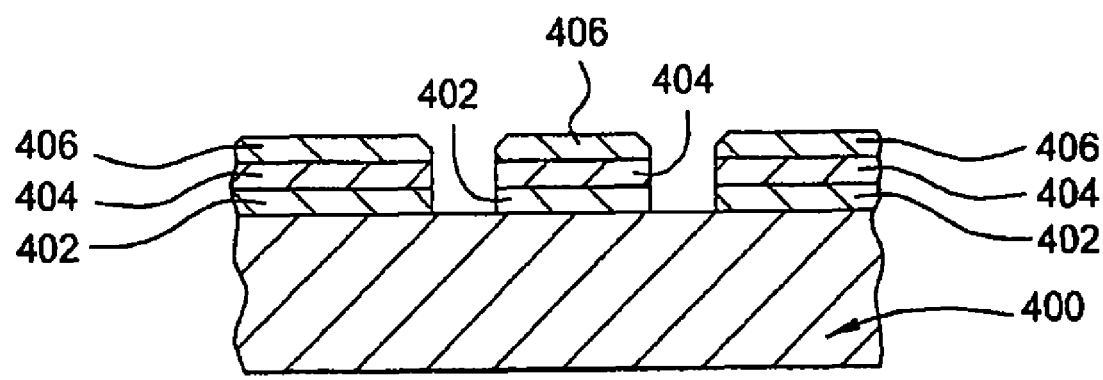

FIG. 5b illustrates a layer of energy sensitive resist material 406 formed on the substrate structure 450 of FIG. 5a. The layer of energy sensitive resist material may be spin coated on the substrate to a thickness within the range of about 2000 Å to about 6000 Å. The energy sensitive resist material is sensitive to DUV radiation having a wavelength less than 250 nm. An image of a pattern may be introduced into the layer of energy sensitive resist material 406 by exposing such energy sensitive resist material 406 to DUV radiation via mask 408. The image of the pattern introduced into the layer of energy sensitive resist material 406 may be developed in an appropriate developer to define the pattern through such layer as shown in FIG. 5c. Thereafter, referring to FIG. 5d, the pattern defined in the energy sensitive resist material 406 may be transferred through both graded ARC layers 404, 402 using the energy sensitive resist material 406 as a mask. The pattern may be transferred through the graded ARC layers 404, 402 by etching them using an appropriate chemical etchant such as a gas mixture comprising a hydrogen-containing fluorocarbon ($C_xF_yH_z$) and one or more gases selected from the group consisting of hydrogen ($H_2$), nitrogen ($N_2$), oxygen ($O_2$), argon (Ar), and helium (He). After the multi-layer ARC is patterned, such pattern is optionally transferred into the substrate.

While the foregoing is directed to embodiments of the present invention, other and further embodiments of the invention may be devised without departing from the basic scope thereof, and the scope thereof is determined by the claims that follow.

The invention claimed is:

1. A semiconductor device, comprising:
an amorphous carbon layer deposited over a substrate;
an anti-reflective coating layer deposited on the amorphous carbon layer, wherein the anti-reflective coating layer has a refractive index and an absorption coefficient that are gradually varied across the thickness of the anti-reflective coating layer; and
an energy sensitive resist layer deposited over the anti-reflective coating layer, wherein the refractive index and the absorption coefficient at a bottom surface of the anti-reflective coating layer substantially match a refractive index and an absorption coefficient of the amorphous carbon layer, and the refractive index and the absorption coefficient at a top surface of the anti-reflective coating layer substantially match a refractive index and an absorption coefficient of the energy sensitive resist layer.

2. The device of claim 1, wherein the refractive index of the anti-reflective coating layer is varied in the range of about 1.0 to about 2.2.

3. The device of claim 1, wherein the absorption coefficient of the anti-reflective coating layer is varied in the range of about 0 to about 1.0 at wavelengths less than about 250 nm.

4. The device of claim 1, wherein the anti-reflective coating layer is formed from a gas mixture comprising a silicon source and an oxygen source.

5. The device of claim 4, wherein the silicon source comprises silane, disilane, chlorosilane, dichlorosilane, trimethylsilane, or tetramethylsilane.

6. The device of claim 4, wherein the gas mixture further comprises a carbon source selected from the group consisting of propylene ($C_3H_6$), propyne ($C_3H_4$), propane ($C_3H_8$), butane ($C_4H_{10}$), butylene ($C_4H_8$), butadiene ($C_4H_6$), acetelyne ($C_2H_2$), pentane, pentene, pentadiene, cyclopentane, cyclopentadiene, benzene, toluene, alpha terpinene, phenol, cymene, norbornadiene, and combinations thereof.

7. The device of claim 1, wherein the anti-reflective coating layer is formed from a gas mixture comprising an organosilicon compound.

8. The device of claim 7, wherein the organosilicon compound comprise tetraethoxysilane (TEOS), triethoxyfluorosilane (TEFS), 1,3,5,7-tetramethylcyclotetrasiloxane (TMCTS), dimethyldiethoxy silane (DMDE), octomethylcyclotetrasiloxane (OMCTS), or combinations thereof.

9. The device of claim 1, wherein the absorption coefficient of at the bottom surface of the anti-reflective coating layer corresponds to the absorption coefficient of the amorphous carbon layer within a range of about +/−0.05.

10. The device of claim 1, wherein the absorption coefficient of at the top surface of the anti-reflective coating layer corresponds to the absorption coefficient of the energy sensitive resist within a range of about +/−0.05.

11. The device of claim 1, wherein the amorphous carbon layer and the anti-reflective coating layer are deposited in the same processing chamber without breaking vacuum.

* * * * *